(12) United States Patent
Nam et al.

(10) Patent No.: US 7,423,485 B2
(45) Date of Patent: Sep. 9, 2008

(54) DIFFERENTIAL CIRCUIT WITH IMPROVED LINEARITY

(75) Inventors: Il-Ku Nam, Anyang-Si (KR); Hyun-Won Mun, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 19 days.

(21) Appl. No.: 11/443,619

(22) Filed: May 31, 2006

(65) Prior Publication Data

US 2007/0096813 A1    May 3, 2007

(30) Foreign Application Priority Data

Nov. 1, 2005    (KR) .................. 10-2005-0103725

(51) Int. Cl.
*H03F 3/45* (2006.01)
(52) U.S. Cl. ..................... 330/252; 330/253
(58) Field of Classification Search .............. 330/252, 330/254, 253, 261
See application file for complete search history.

(56) References Cited

U.S. PATENT DOCUMENTS

| | | | | |
|---|---|---|---|---|
| 4,460,872 A | | 7/1984 | Mattisson | .................. 330/252 |
| 4,936,465 A | * | 6/1990 | Zold | .................. 330/252 |
| 5,313,172 A | * | 5/1994 | Vagher | .................. 330/254 |
| 5,461,342 A | * | 10/1995 | Crabtree | .................. 330/252 |
| 5,523,717 A | * | 6/1996 | Kimura | .................. 330/252 |
| 5,619,169 A | * | 4/1997 | Matsuura | .................. 330/254 |
| 6,445,251 B1 | * | 9/2002 | Robinson | .................. 330/254 |
| 6,871,057 B2 | * | 3/2005 | Ugajin et al. | .................. 455/323 |

OTHER PUBLICATIONS

Japanese Patent Application No. 04-120025, having Publication date of Nov. 5, 1993 (w/English Abstract page).
Korean Patent Application No. 1019990029627, having Publication date of Feb. 15, 2001 (w/ English Abstract page).
Korean Patent Application No. 1019920003980, having Publication date of Jan. 16, 1993 (w/ English Abstract page).
Korean Patent Application No. 101995015257, having Publication date of Jan. 26, 1996 (w/ English Abstract page).
Korean Patent Application No. 08-320825, having Publication date of Jun. 2, 1998 (w/ English Abstract page).

* cited by examiner

*Primary Examiner*—Henry K Choe
(74) *Attorney, Agent, or Firm*—Monica H. Choi

(57) ABSTRACT

A differential circuit includes main transistors differentially coupled for converting differential input signals into main differential currents at output terminals. The differential circuit also includes compensation transistors coupled to the main transistors for converting the differential input signals into compensation differential currents at the output terminals. Each compensation differential current has an exponential current-voltage characteristic for improving linearity of the differential circuit.

20 Claims, 6 Drawing Sheets

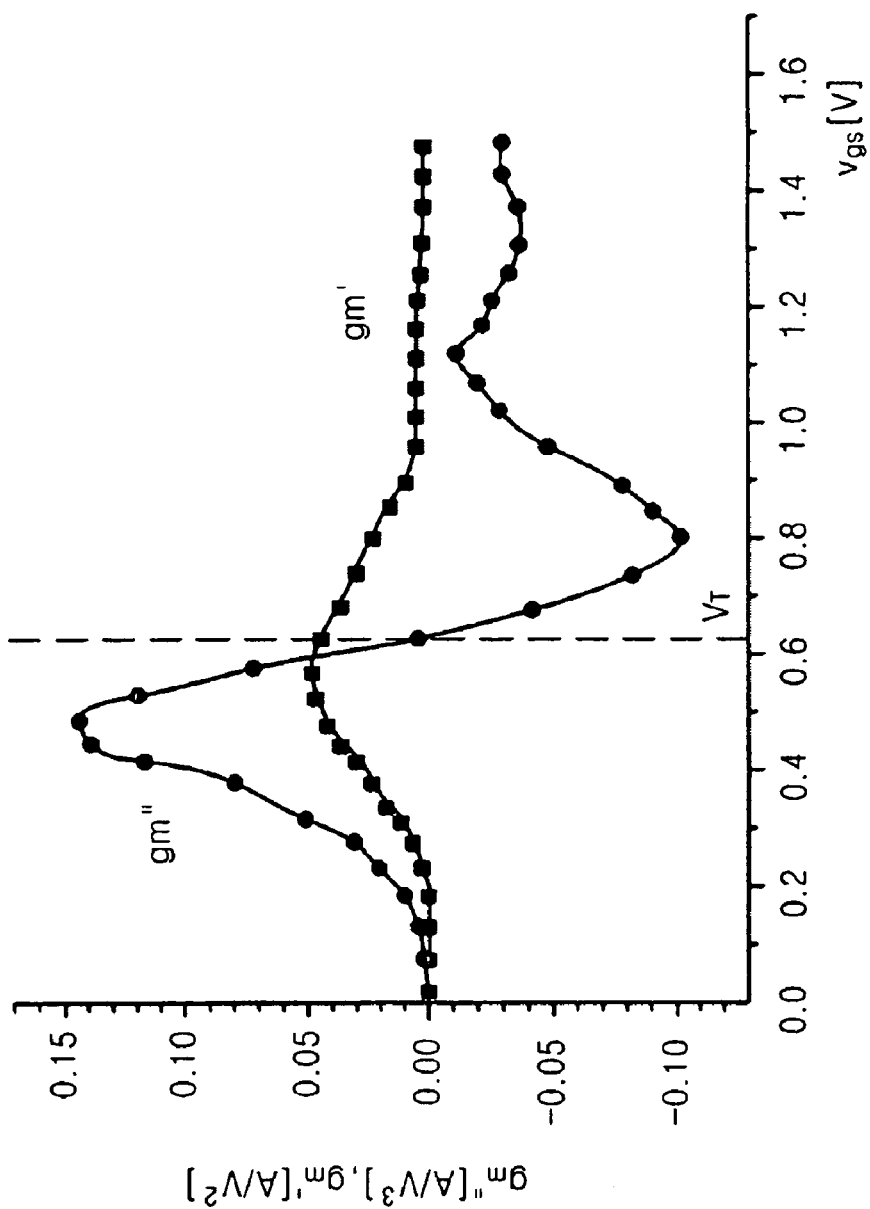
FIG. 3 (CONVENTIONAL)

DIFFERENTIAL CIRCUIT WITH IMPROVED LINEARITY

BACKGROUND OF THE INVENTION

This application claims priority to Korean Patent Application No. 2005-103725, filed on Nov. 1, 2005 in the Korean Intellectual Property Office, the disclosure of which is incorporated herein in its entirety by reference.

1. Field of the Invention

The present invention relates generally to differential circuits, and more particularly to a differential circuit having compensation transistors with an exponential current-voltage characteristic for improved linearity of the differential circuit.

2. Description of the Related Art

For various wired/wireless communication systems, the linearity of a receiver is increasingly important. The linearity of an amplifier and a frequency converter within such a receiver is an important parameter in designing a radio frequency (RF) transceiver. The frequency converter converts a RF signal into an intermediate frequency (IF) signal having a frequency between that of the RF signal and a base-band signal.

The linearity of the frequency converter allows for preserving signal integrity with prevention of interference by ambient signals. In particular, the linearity of a mixer and/or an amplifier within the frequency converter especially determines the performance of the frequency converter.

Thus, increasing the linearity of any differential circuit within such an amplifier or such a mixer is desired for improving the linearity of the receiver.

SUMMARY OF THE INVENTION

Accordingly, a differential circuit of the present invention includes compensation transistors for improving linearity of the differential circuit used in such components of the receiver.

In one aspect of the present invention, a differential circuit includes main transistors differentially coupled for converting differential input signals into main differential currents at output terminals. In addition, the differential circuit includes compensation transistors coupled to the main transistors for converting the differential input signals into compensation differential currents at the output terminals. Each compensation differential current has an exponential current-voltage characteristic for improving linearity of the differential circuit.

In an example embodiment of the present invention, the compensation transistors are each a BJT (bipolar junction transistor). In that case, the respective emitter of each compensation BJT is coupled to a common node or to a respective impedance that determines a respective compensation current.

In another example embodiment of the present invention, the main transistors are of a different type from the compensation transistors. For example, the main transistors are each a MOSFET (metal oxide semiconductor field effect transistor), and the compensation transistors are each a BJT (bipolar junction transistor).

In a further example embodiment of the present invention, the main transistors are of a same type as the compensation transistors. For example, the main transistors and the compensation transistors are each a BJT (bipolar junction transistor).

Such compensation transistors improve the linearity of the differential circuit. Such a differential circuit in turn improves the linearity of the receiver when incorporated into a differential amplifier and/or a mixer of the receiver.

BRIEF DESCRIPTION OF THE DRAWINGS

The above and other features and advantages of the present invention will become more apparent when described in detailed exemplary embodiments thereof with reference to the attached drawings in which:

FIG. 3 shows a graph plotting $g_m'$ and $g_m''$ (first and second derivatives of transconductance) versus $v_{gs}$ (gate to source) voltage for a typical MOSFET;

The figures referred to herein are drawn for clarity of illustration and are not necessarily drawn to scale.

DETAILED DESCRIPTION OF THE INVENTION

Figure 1:
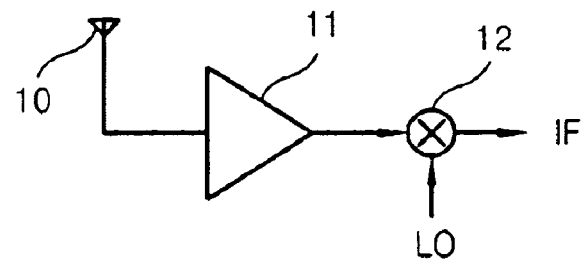
FIG. 1 shows a block diagram of a frequency converter typically included in a conventional radio frequency (RF) receiver.

FIG. 1 shows a block diagram of a frequency converter typically included in a conventional radio frequency (RF) receiver. An RF signal received at an antenna 10 is amplified by a low noise amplifier (LNA) 11. The amplified RF signal is then multiplied with a local oscillating (LO) signal by a mixer 12 for being converted into an intermediate frequency (IF) signal or a base-band signal.

Figure 2A:
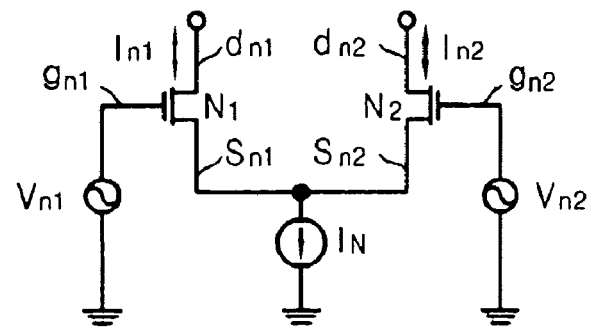
FIG. 2A shows a conventional differential circuit implemented with MOSFETs (metal oxide semiconductor field effect transistors)
Figure 2B:
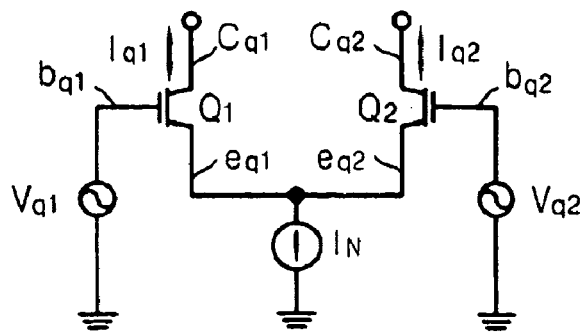
FIG. 2B shows a conventional differential circuit implemented with BJTs (bipolar junction transistors)

FIG. 2A shows a conventional differential circuit implemented with MOSFETs (metal oxide semiconductor field effect transistors). FIG. 2B shows a conventional differential circuit implemented with BJTs (bipolar junction transistors).

The conventional differential circuit of FIG. 2A includes a first MOSFET $N_1$ and a second MOSFET $N_2$ that are differentially coupled. Thus, sources $S_{n1}$ and $S_{n2}$ of the first and second MOSFETs $N_1$ and $N_2$ are coupled together to a bias current $I_N$. In addition, a gate $g_{n1}$ of the first MOSFET $N_1$ has a first input signal $V_{n1}$ applied thereon, and a gate $g_{n2}$ of the second MOSFET $N_2$ has a second input signal $V_{n2}$ applied thereon.

When the differential circuit is within an RF receiver, the first and second input signals $V_{n1}$ and $V_{n2}$ correspond to received RF signals $V_{RF}^+$ and $V_{RF}^-$. In addition, drains $d_{n1}$ and $d_{n2}$ of the MOSFETs N1 and N2 are each coupled to a respective load (not shown) when used in an amplifier. Alternatively, the drain terminals $d_{n1}$ and $d_{n2}$ are coupled to a switching unit (not shown) when used in a mixer.

The conventional differential circuit of FIG. 2B includes a first BJT $Q_1$ and a second BJT $Q_2$ that are differentially coupled. Thus, the emitters $e_{q1}$ and $e_{q2}$ of the first and second BJTs Q1 and Q2 are coupled to a bias current $I_N$. In addition, a base $b_{q1}$ of the first BJT Q1 has a first input signal $V_{q1}$ applied thereon, and a base $b_{q2}$ of the second BJT Q2 has a second input signal $V_{q2}$ applied thereon.

When the differential circuit is within an RF receiver, the first and second input signals $V_{q1}$ and $V_{q2}$ correspond to received RF signals $V_{RF}^+$ and $V_{RF}^-$. In addition, collectors $C_{q1}$ and $C_{q2}$ of the BJTs $Q_1$ and $Q_2$ are each coupled to a respective load (not shown) when used in an amplifier. Alternatively, the collectors $C_{q1}$ and $Cq2$ are coupled to a switching unit (not shown) when used in a mixer.

The differential circuit of FIG. 2A converts the differential voltage signals $V_{n1}$ and $V_{n2}$ into differential current signals $I_{n1}$ and $I_{n2}$ with transconductance $g_m$ of the MOSFETs $N_1$ and $N_2$. Similarly, the differential circuit of FIG. 2B converts the differential voltage signals $V_{q1}$ and $V_{q2}$ into differential current signals $I_{q1}$ and $I_{q2}$ with transconductance $g_m$ of the BJTs $Q_1$ and $Q_2$.

A drain-to-source current $I_{ds}$ of a MOSFET such as the first MOSFET N1 may be expressed with respect to a gate-to-source voltage $V_{gs}$ according to Equation (1) as follows:

$$I_{ds} = I_{dc} + g_m v_{gs} + \frac{g'_m}{2!} v_{gs}^2 + \frac{g''_m}{3!} v_{gs}^3 + \ldots \tag{1}$$

$I_{dc}$ is a dc component, $g_m$ is the transconductance of the MOSFET N1, $g_m'$ is a first derivative of the transconductance $g_m$, and $g_m''$ is a second derivative of the transconductance $g_m$, and so on for further derivatives of the transconductance $g_m$.

According to above Equation (1), the third power of the voltage $V_{gs}$ includes a primary frequency component, and therefore, $g_m''$ influences the linearity of the differential circuit. In addition, $g_m''$ has a negative value when a value of $(V_{gs} - V_T)$ is in a range of 0.1 through 0.45 V, as shown in FIG. 3, where $V_T$ is a threshold voltage of the MOSFET N1. Therefore, if positive compensation would offset such a negative $g_m''$, the linearity of the differential circuit may be improved.

Hereinafter, the non-linearity of the MOS transistor differential circuit and the BJT differential circuit is analytically described.

The I-V (current-voltage) characteristic of a MOSFET is expressed by the following Equation (2):

$$I = \frac{k'}{2} \frac{W}{L} (V_{gs} - V_T)^2 \tag{2}$$

k' is a constant determined by physical characteristics of the MOSFET such as the mobility and the thickness of the dielectric layer of the MOSFEET. W is the channel width of the MOSFET, and L is the channel length of the MOSFET.

Based on the above Equation (2), the currents $I_{n1}$ and $I_{n2}$ in the differential circuit of FIG. 2A are expressed by Equations (3) as follows:

$$I_{n1} = \frac{I_N}{2} + \frac{k'}{4} \frac{W}{L} V_x \sqrt{\frac{4I_N}{k'(W/L)} - V_x^2} \tag{3}$$

$$I_{n2} = \frac{I_N}{2} - \frac{k'}{4} \frac{W}{L} V_x \sqrt{\frac{4I_N}{k'(W/L)} - V_x^2}$$

$$단, \; |V_x = V_{n1} - V_{n2}| \le \sqrt{\frac{2I_N}{k'(W/L)}}.$$

Since a differential operation is symmetrical, the current of just the left MOSFET $N_1$ of FIG. 2A is now described. A power series representation of the current $I_{n1}$ of such a MOSFET $N_1$ is expressed by the Equations (4) below:

$$I_{n1} = \frac{I_N}{2} + \frac{k'}{4} \frac{W}{L} V_x \sqrt{\frac{4I_N}{k'(W/L)} - V_x^2} \tag{4}$$

$$= \frac{I_N}{2} + \alpha_1 V_x + \alpha_2 V_x^2 + \alpha_3 V_x^3 + \ldots$$

$$\alpha_1 = \frac{BI_{n1}}{BV_x}$$

$$= \frac{k'}{4} \frac{W}{L} \left( \frac{4I_N}{k'(W/L)} - V_x^2 \right)^{1/2} - \frac{k'}{4} \frac{W}{L} V_x^2 \left( \frac{4I_N}{k'(W/L)} - V_x^2 \right)^{-1/2}$$

$$\alpha_2 = \frac{B^2 I_{n1}}{B^2 V_x}$$

$$= \frac{-3k'}{4} \frac{W}{L} V_x \left( \frac{4I_N}{k'(W/L)} - V_x^2 \right)^{-1/2} - \frac{k'}{4} \frac{W}{L} V_x^3 \left( \frac{4I_N}{k'(W/L)} - V_x^2 \right)^{-3/2}$$

$$\alpha_3 = \frac{B^3 I_{n1}}{B^3 V_x}$$

$$= \frac{-3k'}{4} \frac{W}{L} V_x \left( \frac{4I_N}{k'(W/L)} - V_x^2 \right)^{-1/2} - \frac{6k'}{4} \frac{W}{L} V_x^2 \left( \frac{4I_N}{k'(W/L)} - V_x^2 \right)^{-3/2} -$$

$$\frac{3k'}{4} \frac{W}{L} V_x^4 \left( \frac{4I_N}{k'(W/L)} - V_x^2 \right)^{-5/2}$$

As shown in the above Equations (4), a third component $\alpha_3$ always has a negative value.

The I-V (current-voltage) characteristic of a BJT is expressed by Equation (5) as follows:

$$I = I_S \exp\left(\frac{V_{be}}{V_T}\right) \tag{5}$$

$V_{be}$ is a base-to-emitter voltage, $I_S$ is a saturation current, and $V_T$ is a threshold voltage, of the BJT.

Based on the above Equation (5), the currents $I_{q1}$ and $I_{q2}$ in the differential circuit of FIG. 2B are expressed by Equations (6) below:

$$I_{q1} = \alpha_F \frac{I_N}{1 + \exp\left(\frac{V_x}{V_T}\right)} \tag{6}$$

$$I_{q2} = \alpha_F \frac{I_N}{1 + \exp\left(-\frac{V_x}{V_T}\right)}.$$

$\alpha_F$ is a gain of a forward current for the BJT Q1 or Q2, and $V_x$ is a difference between the input signals $V_{q1}$ and $V_{q2}$.

Since a differential operation is symmetrical, the current of just the left BJT Q1 of FIG. 2B is now described. A power series representation of $I_{q1}$ is expressed by the Equations (7) below:

$$I_{q1} = \alpha_F \frac{I_N}{1 + \exp\left(\frac{V_x}{V_T}\right)} \tag{7}$$

$$= \alpha_F \frac{I_N}{2} + \alpha_1 V_x + \alpha_2 V_x^2 + \alpha_3 V_x^3 + \ldots$$

-continued $$\alpha_1 = \frac{BI_{q1}}{BV_x} = -\frac{\alpha_F I_N}{V_T}\left(1+\exp\left(\frac{V_x}{V_T}\right)\right)^{-2}$$

$$\alpha_2 = \frac{BI_{q1}^2}{B^2 V_x^2} = \frac{2\alpha_F I_N}{V_T^2}\left(1+\exp\left(\frac{V_x}{V_T}\right)\right)^{-3}$$

$$\alpha_3 = \frac{BI_{q1}^3}{B^3 V_x} = -\frac{6\alpha_F I_N}{V_T^3}\left(1+\exp\left(\frac{V_x}{V_T}\right)\right)^{-4}$$

where $\alpha_F$ is a gain of a forward current.

As shown in the above Equation (7), a third component $\alpha_3$ always has a negative value for the differential circuit of FIG. 2B.

Figure 4:
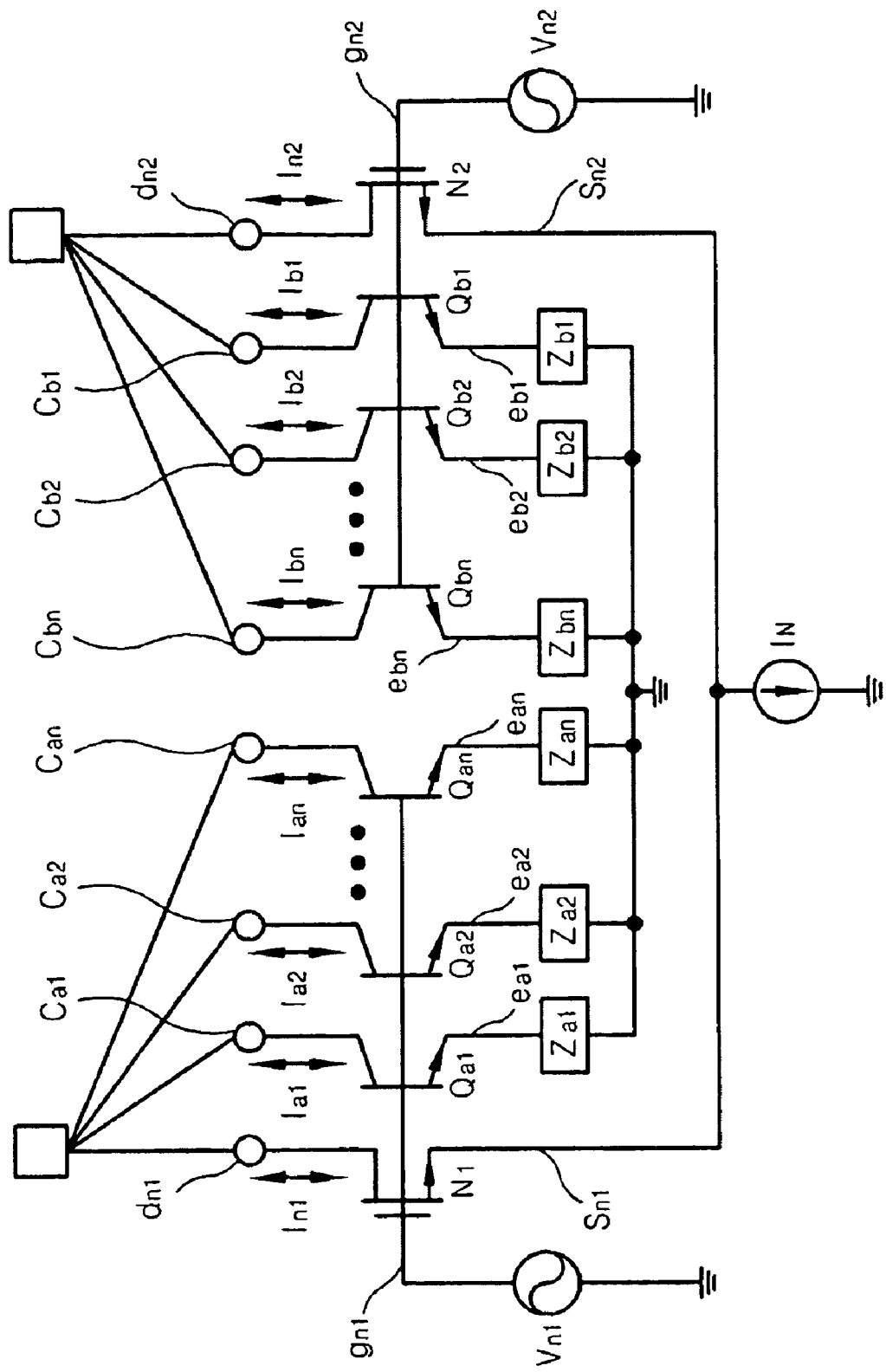
FIG. 4 shows a differential circuit according to an embodiment of the present invention.

FIG. 4 shows a differential circuit according to an embodiment of the present invention. The differential circuit of FIG. 4 includes main transistors N1 and N2 that are MOSFETs (metal oxide semiconductor field effect transistors) being differentially coupled. Thus, sources $S_{n1}$ and $S_{n2}$ of the first and second MOSFETs $N_1$ and $N_2$ are coupled together to a bias current $I_N$. In addition, a gate $g_{n1}$ of the first MOSFET $N_1$ has a first input signal $V_{n1}$ applied thereon, and a gate $g_{n2}$ of the second MOSFET $N_2$ has a second input signal $V_{n2}$ applied thereon.

Furthermore, drains $d_{n1}$ and $d_{n2}$ of the MOSFETs $N_1$ and $N_2$ are coupled to first and second output terminals, respectively. The MOSFETs $N_1$ and $N_2$ convert the differential input signals $V_{n1}$ and $V_{n2}$ into main differential currents $I_{n1}$ and $I_{n2}$ respectively through the drains $d_{n1}$ and $d_{n2}$ of the MOSFETs $N_1$ and $N_2$.

In addition, the differential circuit of FIG. 4 includes at least one pair of compensation transistors coupled between the main MOSFETs $N_1$ and $N_2$. FIG. 4 shows n-pairs of such compensation transistors that are each a BJT. Thus, $Q_{a1}$ and $Q_{b1}$ form a first pair, $Q_{a2}$ and $Q_{b2}$ form a second pair, and so on to the n-th pair formed by $Q_{an}$ and $Q_{bn}$.

One compensation transistor of a pair is coupled to the first main MOSFET $N_1$, and the other compensation transistor of the pair is coupled to the second main MOSFET $N_2$. For example, for the first pair formed by $Q_{a1}$ and $Q_{b1}$, the collector $C_{a1}$ of $Q_{a1}$ is coupled to the drain $d_{n1}$ of the first MOSFET $N_1$ at the first output terminal, and the base of $Q_{a1}$ is coupled to the gate $g_{n1}$ of the first MOSFET $N_1$. On the other side, the collector $C_{b1}$ of $Q_{b1}$ is coupled to the drain $d_{n2}$ of the second MOSFET $N_2$ at the second output terminal, and the base of $Q_{b1}$ is coupled to the gate $g_{n2}$ of the second MOSFET $N_2$.

The respective emitter $e_{a1}$, $e_{b1}$, ..., $e_{an}$, $e_{bn}$ of each of the compensation BJTs $Q_{a1}$, $Q_{b1}$, ..., $Q_{an}$, $Q_{bn}$ is coupled to a common node such as a ground node for example through a respective degenerate impedance $Z_{a1}$, $Z_{b1}$, ..., $Z_{an}$, $Z_{bn}$. The present invention may also be practice with the respective emitter $e_{a1}$, $e_{b1}$, ..., $e_{an}$, $e_{bn}$ of each of the compensation BJTs $Q_{a1}$, $Q_{b1}$, ..., $Q_{an}$, $Q_{bn}$ being coupled directly to the common node without any degenerate impedance.

Figure 5:
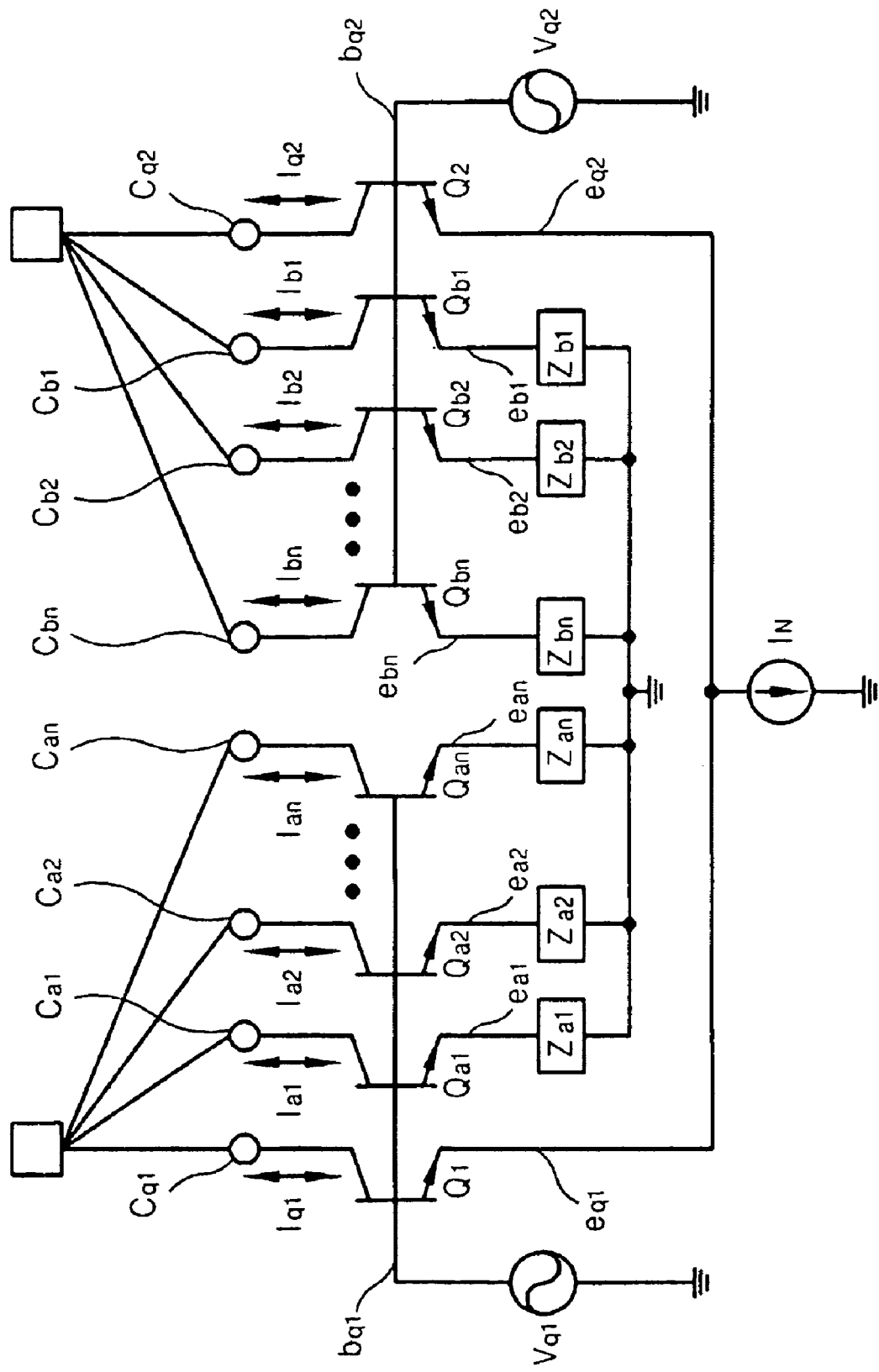
FIG. 5 shows a differential circuit according to another embodiment of the present invention.

FIG. 5 illustrates a differential circuit according to another embodiment of the present invention. FIG. 5 is similar to FIG. 4, but first and second BJTs $Q_1$ and $Q_2$ form the main transistors that are differentially coupled. Thus, the emitters $e_{q1}$ and $e_{q2}$ of the first and second BJTs $Q_1$ and $Q_2$ are coupled to a bias current $I_N$. In addition, a base $b_{q1}$ of the first BJT $Q_1$ has a first input signal $V_{q1}$ applied thereon, and a base $b_{q2}$ of the second BJT $Q_2$ has a second input signal $V_{q2}$ applied thereon.

Furthermore, collectors $C_{q1}$ and $C_{q2}$ of the BJTs $Q_1$ and $Q_2$ are coupled to first and second output terminals, respectively. The BJTs $Q_1$ and $Q_2$ convert the differential input signals $V_{q1}$ and $V_{q2}$ into main differential currents $I_{q1}$ and $I_{q2}$ respectively through the collectors $C_{q1}$ and $C_{q2}$ of the BJTs $Q_1$ and $Q_2$.

Furthermore, the differential circuit of FIG. 5 includes compensation BJTs $Q_{a1}$, $Q_{b1}$, ..., $Q_{an}$, $Q_{bn}$ coupled to the main BJTs $Q_1$ and $Q_2$, similarly as described with respect to FIG. 4. FIG. 5 is different from FIG. 4 in that the main transistors $Q_1$ and $Q_2$ and the compensation transistors $Q_{a1}$, $Q_{b1}$, ..., $Q_{an}$, $Q_{bn}$ are each a BJT in FIG. 5. In contrast in FIG. 4, the main transistors $N_1$ and $N_2$ are MOSFETs, while the compensation transistors $Q_{a1}$, $Q_{b1}$, ..., $Q_{an}$, $Q_{bn}$ are each a BJT.

The respective values of the degenerate impedances $Z_{a1}$, $Z_{b1}$, ..., $Z_{an}$, $Z_{bn}$ may be determined through experiments, as described below. In either FIG. 4 or 5, each of the compensation transistors $Q_{a1}$, $Q_{b1}$, ..., $Q_{an}$, $Q_{bn}$ generates a respective compensation differential current $I_{a1}$, $I_{b1}$, ..., $I_{an}$, $I_{bn}$.

Consider an example differential pair of compensation currents $I_{a1}$ and $I_{b1}$ which is expressed by Equations (8) below based on Equation (5) above when the degenerate impedances $Z_{a1}$ and $Z_{b1}$ are negligible:

$$I_{a1} = I_S \exp\left(\frac{V_x}{V_T}\right) \qquad (8)$$

$$I_{b1} = I_S \exp\left(-\frac{V_x}{V_T}\right)$$

$V_x$ is a difference between the input signals $V_{q1}$ and $V_{q2}$ or a difference between the input signals $V_{n1}$ and $V_{n2}$.

A description is set forth with respect to just the left compensation BJT $Q_{a1}$ since a differential operation is symmetrical. A power series representation of $I_{a1}$ is expressed with Equations (9) below:

$$I_{a1} = I_S \exp\left(\frac{V_x}{V_T}\right) \qquad (9)$$

$$= I_S + \beta_1 V_x + \beta_2 V_x^2 + \beta_3 V_x^3 + \ldots$$

$$\beta_1 = \frac{BI_{a1}}{BV_x} = \frac{I_S}{V_T}\exp\left(\frac{V_x}{V_T}\right)$$

$$\beta_2 = \frac{B^2 I_{a1}}{B^2 V_x} = \frac{I_S}{V_T^2}\exp\left(\frac{V_x}{V_T}\right)$$

$$\beta_3 = \frac{B^3 I_{a1}}{B^3 V_x} = \frac{I_S}{V_T^3}\exp\left(\frac{V_x}{V_T}\right)$$

According to Equations (9), $\beta_3$ always has a positive value. Thus, with the multiple pairs of the compensation BJTs $Q_{a1}$, $Q_{b1}$, ..., $Q_{an}$, $Q_{bn}$, $\alpha_3$ of Equation (4) or (7) having the negative value may be offset. Such offset results because the compensation transistors $Q_{a1}$, $Q_{b1}$, ..., $Q_{an}$, $Q_{bn}$ are each a BJT having an exponential current-voltage characteristic.

Further if the degenerate impedance is considered with respect to $\beta_3$ of Equation (9), an effective $\beta_{3,Z}$ can be expressed by Equation (10) below:

$$\beta_{3,Z} = \beta_3 e^{\left(-\frac{I_Z Z_{a1}}{nV_T}\right)} \qquad (10)$$

where $Z_{a1}$ is the degenerate impedance, $I_Z$ is a bias current flowing in a transistor connected to the degenerate impedance $Z_{a1}$, and "n" just in the above equation is a fitting factor which may be obtained through experiments or simulations.

Accordingly, the transconductance $g_m$ is determined by a value of the degenerate impedance $Z_{a1}$ such that the values of the transconductance $g_m$ corresponding to $\alpha_3$ may be further compensated by controlling the degenerate impedances $Z_{a1}$, $Z_{b1}$, ..., $Z_{an}$, $Z_{bn}$. With the compensation currents generated by the compensation transistors $Q_{a1}$, $Q_{b1}$, ..., $Q_{an}$, $Q_{bn}$, signal distortion from interference may be reduced for maximizing linearity of the differential circuits of FIGS. 4 and 5.

Figure 6:
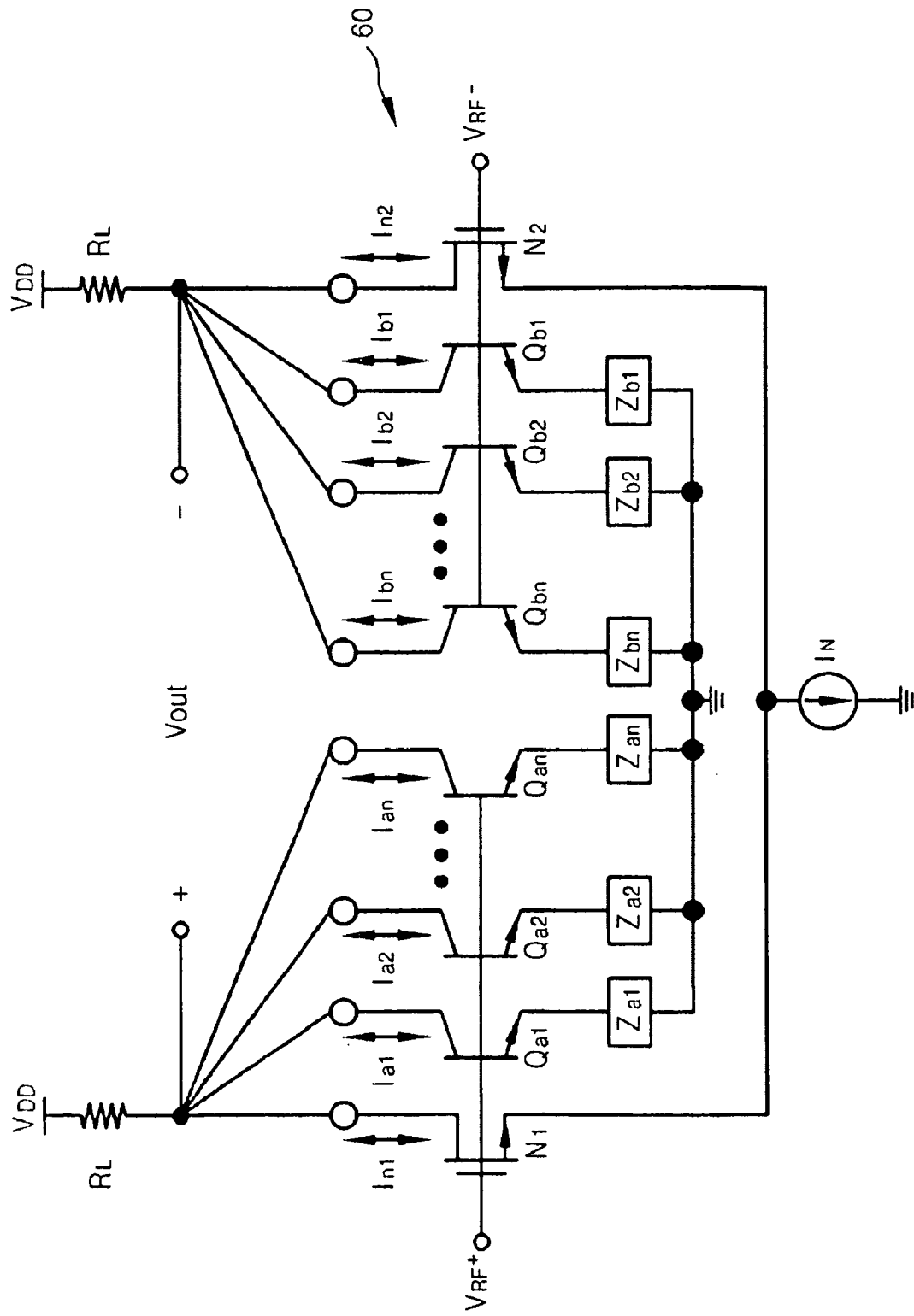
FIG. 6 shows a differential amplifier according to an embodiment of the present invention.

FIG. 6 shows a circuit diagram of a differential amplifier including a differential circuit 60 which may be the differential circuit of FIG. 4 or 5, according to an embodiment of the present invention. The differential amplifier further includes a first load resistor with resistance $R_L$ coupled to the first output terminal at the drain of the first MOSFET $N_1$, and a second load resistor with resistance $R_L$ coupled to the second output terminal at the drain of the second MOSFET $N_2$. Thus, an output voltage $V_{out}$ is generated across such first and second output terminals.

Figure 7:
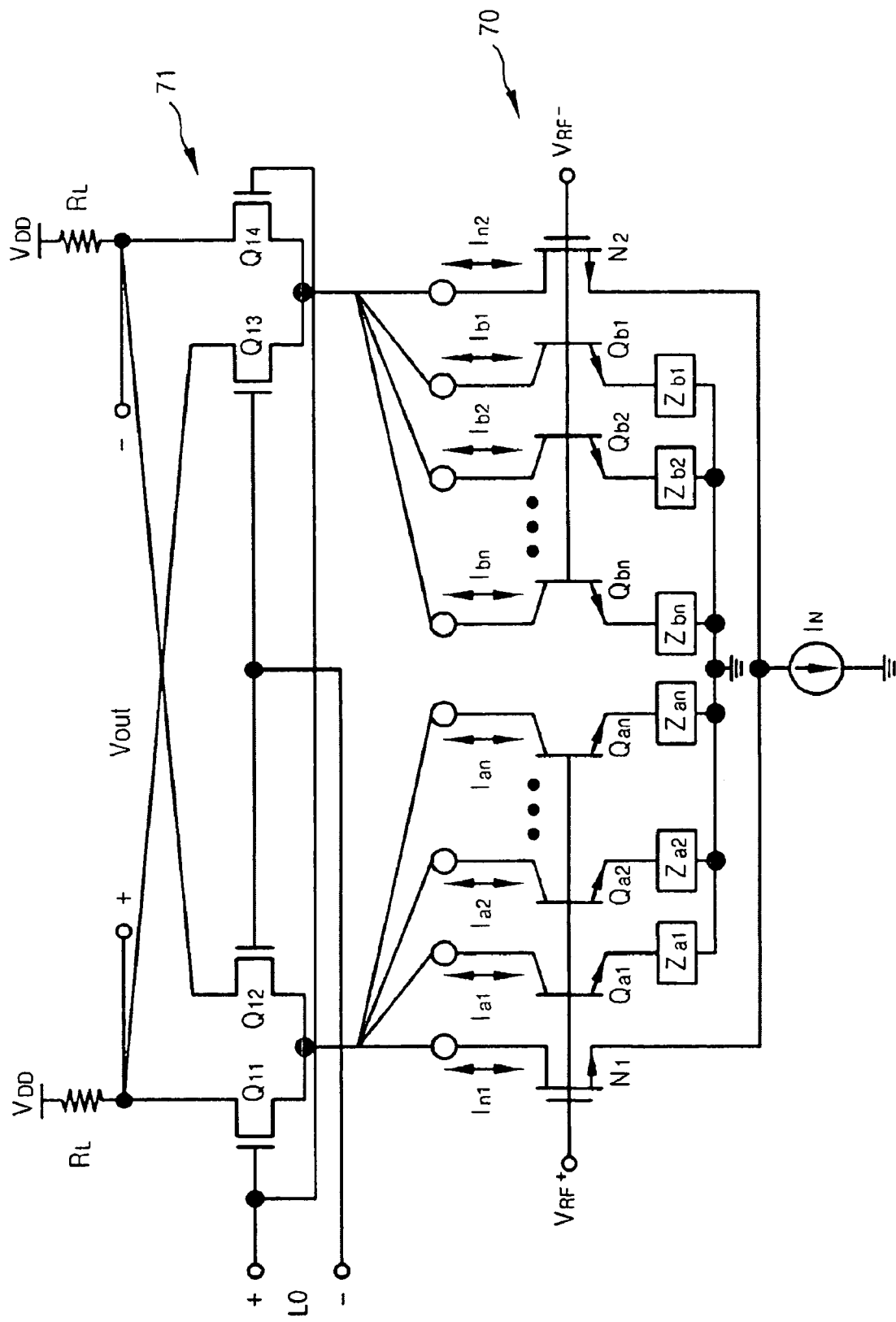
FIG. 7 shows a mixer according to an embodiment of the present invention.

FIG. 7 shows a circuit diagram of a mixer including a differential circuit 70 which may be the differential circuit of FIG. 4 or 5, according to an embodiment of the present invention. The mixer further includes a switching unit 71 coupled across the first and second output terminals at the drains of the first and second MOSFETs $N_1$ and $N_2$.

The switching unit 71 of FIG. 7 is typically used in a Gilbert cell mixer, and the present invention may be carried out using other types of the switching unit. The switching unit 71 includes a plurality of transistors $Q_{11}$, $Q_{12}$, $Q_{13}$, and $Q_{14}$ coupled to be switched in response to a differential local oscillating signal (LO) from a voltage-controlled oscillator (not shown).

Switching of the transistors $Q_{11}$ and $Q_{14}$ alternates with switching of the transistors $Q_{12}$ and $Q_{13}$ according to the differential LO signal. Frequency mixing is performed by adding or subtracting the frequency of the LO signal to or from the frequency of an RF signal output from the differential circuit 70.

According to simulation results, a BJT differential amplifier and a BJT mixer (i.e., including the differential circuit of FIG. 5) according to the present invention were improved by about more than 10 dB in terms of an input third order intercept point (IIP3), an index of linearity, as compared to conventional ones. A MOSFET differential amplifier and a MOSFET mixer (i.e., including the differential circuit of FIG. 4) according to the present invention were improved by about more than 4 dB in terms of the IIP3 as compared to conventional ones. Meanwhile, power consumption due to the additional compensation BJT pairs is very slight and negligible.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, any number of elements or type of devices illustrated and described herein are by way of example only.

Thus, a differential circuit according to an embodiment of the present invention may be formed in any of BJT, SiGe heterojunction bipolar transistor (HBT), InP HBT, and bipolar complementary metal oxide semiconductor (BiCMOS) processes and CMOS processes having a vertical BJT. Fabrication of a BJT pair has smaller variation than fabrication of a MOS transistor and thus allows for more stable modeling.

The present invention is limited only as defined in the following claims and equivalents thereof.

What is claimed is:

1. A differential circuit comprising:
   main transistors differentially coupled for converting differential input signals into main differential currents at output terminals; and
   compensation transistors coupled to the main transistors for converting the differential input signals into compensation differential currents at the output terminals, wherein each of the compensation transistors is coupled to a ground node without any current source in a respective path between each of the compensation transistors and the ground node,
   and wherein each compensation differential current has an exponential current-voltage characteristic.

2. The differential circuit of claim 1, wherein the compensation transistors are each a BJT (bipolar junction transistor).

3. The differential circuit of claim 2, wherein the respective emitter of each compensation BJT is coupled to the ground node.

4. The differential circuit of claim 2, wherein the respective emitter of each compensation BJT is coupled to a respective impedance that determines a respective compensation current.

5. The differential circuit of claim 1, wherein the main transistors are of a different type from the compensation transistors.

6. The differential circuit of claim 5, wherein the main transistors are each a MOSFET (metal oxide semiconductor field effect transistor), and wherein the compensation transistors are each a BJT (bipolar junction transistor).

7. The differential circuit of claim 1, wherein the main transistors are of a same type as the compensation transistors.

8. The differential circuit of claim 7, wherein the main transistors and the compensation transistors are each a BJT (bipolar junction transistor).

9. A differential amplifier comprising:
   main transistors differentially coupled for converting differential input signals into main differential currents at first and second output terminals;
   compensation transistors coupled to the main transistors for converting the differential input signals into compensation differential currents at the first and second output terminals, wherein each of the compensation transistors is coupled to a ground node without any current source in a respective path between each of the compensation transistors and the ground node,
   and wherein each compensation differential current has an exponential current-voltage characteristic; and
   a first load coupled to the first output terminal and a second load coupled to the second output terminal such that an output voltage is generated between the first and second output terminals.

10. The differential amplifier of claim 9, wherein the compensation transistors are each a BJT (bipolar junction transistor).

11. The differential amplifier of claim 10, wherein the respective emitter of each compensation BJT is coupled to the ground node.

12. The differential amplifier of claim 10, wherein the respective emitter of each compensation BJT is coupled to a respective impedance that determines a respective compensation current.

13. The differential amplifier of claim 9, wherein the main transistors are each a MOSFET (metal oxide semiconductor field effect transistor), and wherein the compensation transistors are each a BJT (bipolar junction transistor).

14. The differential amplifier of claim 9, wherein the main transistors and the compensation transistors are each a BJT (bipolar junction transistor).

15. A mixer for generating differential output signals with frequency conversion from a local oscillating signal and differential input signals, the mixer comprising:

main transistors differentially coupled for converting the differential input signals into main differential currents at first and second output terminals;

compensation transistors coupled to the main transistors for converting the differential input signals into compensation differential currents at the first and second output terminals, wherein each of the compensation transistors is coupled to a ground node without any current source and without any transistor in a respective path between each of the compensation transistors and the ground node, and wherein each compensation differential current has an exponential current-voltage characteristic; and a switching unit, coupled to the first and second output terminals, for receiving the local oscillating signal to generate the differential output signals with frequency conversion from the local oscillating signal and the differential input signals.

16. The mixer of claim 15, wherein the compensation transistors are each a BJT (bipolar junction transistor).

17. The mixer of claim 16, wherein the respective emitter of each compensation BJT is coupled to the ground node.

18. The mixer of claim 16, wherein the respective emitter of each compensation BJT is coupled to a respective impedance that determines a respective compensation current.

19. The mixer of claim 15, wherein the main transistors are each a MOSFET (metal oxide semiconductor field effect transistor), and wherein the compensation transistors are each a BJT (bipolar junction transistor).

20. The mixer of claim 15, wherein the main transistors and the compensation transistors are each a BJT (bipolar junction transistor).

* * * * *